(12) United States Patent
Muljono et al.

(10) Patent No.: US 6,288,563 B1
(45) Date of Patent: Sep. 11, 2001

(54) SLEW RATE CONTROL

(75) Inventors: Harry Muljono, Union City; Alper Ilkbahar, Santa Cruz, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/224,678

(22) Filed: Dec. 31, 1998

(51) Int. Cl.[7] .................................................. H03K 17/16
(52) U.S. Cl. .............................. 326/27; 326/30; 326/83; 326/87
(58) Field of Search ...................... 326/30, 27, 31–34, 326/83, 86, 87; 327/170

(56) References Cited

U.S. PATENT DOCUMENTS

| | | | |
|---|---|---|---|
| 4,992,677 | * 2/1991 | Ishibashi et al. | 326/86 |
| 5,122,690 | * 6/1992 | Bianchi | 326/87 |
| 5,166,555 | * 11/1992 | Kano | 326/87 |
| 5,212,801 | * 5/1993 | Farmer | 326/86 |
| 5,602,494 | * 2/1997 | Sundstrom | 326/30 |
| 5,789,937 | * 8/1998 | Cao et al. | 326/86 |
| 5,869,983 | 2/1999 | Ilkbahar et al. | 326/83 |
| 5,898,321 | * 4/1999 | Ilkbahar et al. | 326/87 |
| 5,923,183 | * 7/1999 | Kim et al. | 326/86 |

* cited by examiner

Primary Examiner—Michael Tokar
Assistant Examiner—Don Phu Le
(74) Attorney, Agent, or Firm—Schwegman, Lundberg, Woessner & Kluth, P.A.

(57) ABSTRACT

Controlling the slew rate of a driver circuit. According to one embodiment of the present invention an output buffer includes a driver circuit having an impedance and a pre-driver circuit to control a slew rate of the driver circuit based on the impedance of the driver circuit.

34 Claims, 10 Drawing Sheets

SLEW RATE CONTROL

FIELD OF THE INVENTION

The present invention relates generally to buses for processor based systems, and more particularly to slew rate control for a driver on a bus.

BACKGROUND

Computer systems include a processor, one or more memory devices, and one or more input-output or I/O devices. The processor, the memory devices, and the I/O devices communicate with each other through a bus in the computer system. A bus is a communication link comprising a set of wires or lines connected between the devices listed above. The bus is shared by the devices as they communicate with one another. A bus may also be a set of lines connected between two functional circuits inside an integrated circuit. The bus generally contains a set of control lines and a set of data lines. The control lines carry signals representing requests and acknowledgments and signals to indicate what type of data is on the data lines. The data lines carry data, complex commands, or addresses. A separate set of lines in the bus may be reserved to carry addresses, and these are called address lines. The devices communicate with each other over the bus according to a protocol that governs which devices may use the bus at any one time. The protocol is a set of rules governing communication over the bus that are implemented and enforced by a device that is appointed a bus master.

According to the protocol, at any one time a sender may receive permission to send a signal on to a bus, and one or more receivers receive the signal. Signals are exchanged between the sender and the receiver over the bus in the following manner. The sender includes a driver, such as an output buffer, connected to each bus line it is to send signals to. Likewise, the receiver has an input buffer or another type of circuit connected to each bus line it is to receive signals from. When the sender sends a signal on a particular line it directs the appropriate output buffer to bring the line to a suitable voltage, either high or low. The receiver detects the signal to complete the communication. A reflection of the signal can take place if an output impedance of the output buffer is different from a characteristic impedance of the line. The discontinuity in the impedance causes the reflection. The signal is reflected back and forth along the line and the reflections must dissipate before a new signal can be sent on the line. This slows the operation of the bus and the computer system.

A conventional method of reducing reflection on a bus line is to damp or dissipate the reflections with a termination in an output buffer connected to the bus line. A termination is a dissipating or damping load, typically a resistive device, which has an impedance that substantially reduces a difference between the output impedance of the output buffer and the characteristic impedance of the line.

In high speed bus structures the impedance of devices connected to the bus lines must be similar to the characteristic impedance of the bus lines in order to substantially reduce signal reflection and maintain the speed of signal transfer on the bus. The speed of signal transfer also depends on a substantially uniform slew rate of all the output buffers connected to the bus lines. The slew rate is the rate of change of voltage (voltage change/time) that an output buffer can generate at a terminal on a bus line when the output buffer is changing a signal it is driving on the bus line. The output buffer may change the signal from low to high or high to low. The slew rate may be referred to as a rise time or a fall time of the signal. An optimal slew rate is selected for the bus, and all the output buffers connected to the bus are selected to have a substantially similar slew rate to support high speed signal transfer on the bus.

The selection of output buffers is difficult and expensive because the output impedance and the slew rate of an output buffer can each change due to variations in process, supply voltage, and temperature. For example, if the output buffer is fabricated as part of a circuit in an integrated circuit chip, the fabrication process parameters will affect the slew rate of the resulting output buffer as well as the resistance of transistors or resistors in the output buffer. Those skilled in the art will understand that a chip with a slow process skew operates slowly, and a chip with a fast process skew operates rapidly due to variations in the fabrication process parameters for the chip. In addition, the chip will operate more slowly with a low supply voltage and at a high temperature. Conversely, a high supply voltage and a low temperature will cause the chip to operate more rapidly. The resistance of transistors and resistors in a chip will be greater at higher temperatures.

There remains a need for output buffers in high speed bus structures that operate with an approximately uniform output impedance and slew rate independent of variations in process skew, supply voltage, and temperature. For these and other reasons there is a need for the present invention.

SUMMARY OF THE INVENTION

According to one embodiment of the present invention an output buffer includes a driver circuit having an impedance and a pre-driver circuit to control a slew rate of the driver circuit based on the impedance of the driver circuit. Advantages of the present invention will be apparent to one skilled in the art upon an examination of the detailed description.

DETAILED DESCRIPTION

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

In this description transistors are described as being activated, in an active state, or switched on when they are rendered conductive by an appropriate control signal, and the transistors are described as being in an inactive state or switched off when they are rendered non-conductive by the control signal.

According to an embodiment of the present invention an output buffer drives a data signal on to a line in a bus with an output impedance that is compensated to substantially reduce a difference between the output impedance and a characteristic impedance of the line. This compensation of the output impedance reduces signal reflection in the line. A slew rate of the output buffer, or, in other words, the slew rate at which the data signal is driven on to the line by the output buffer, is modified based on the compensation of the output impedance. The slew rate is modified to be substantially constant while the output impedance is changing. The compensation of the output impedance and the modification of the slew rate are decoupled according to the embodiment of the invention.

Figure 1:
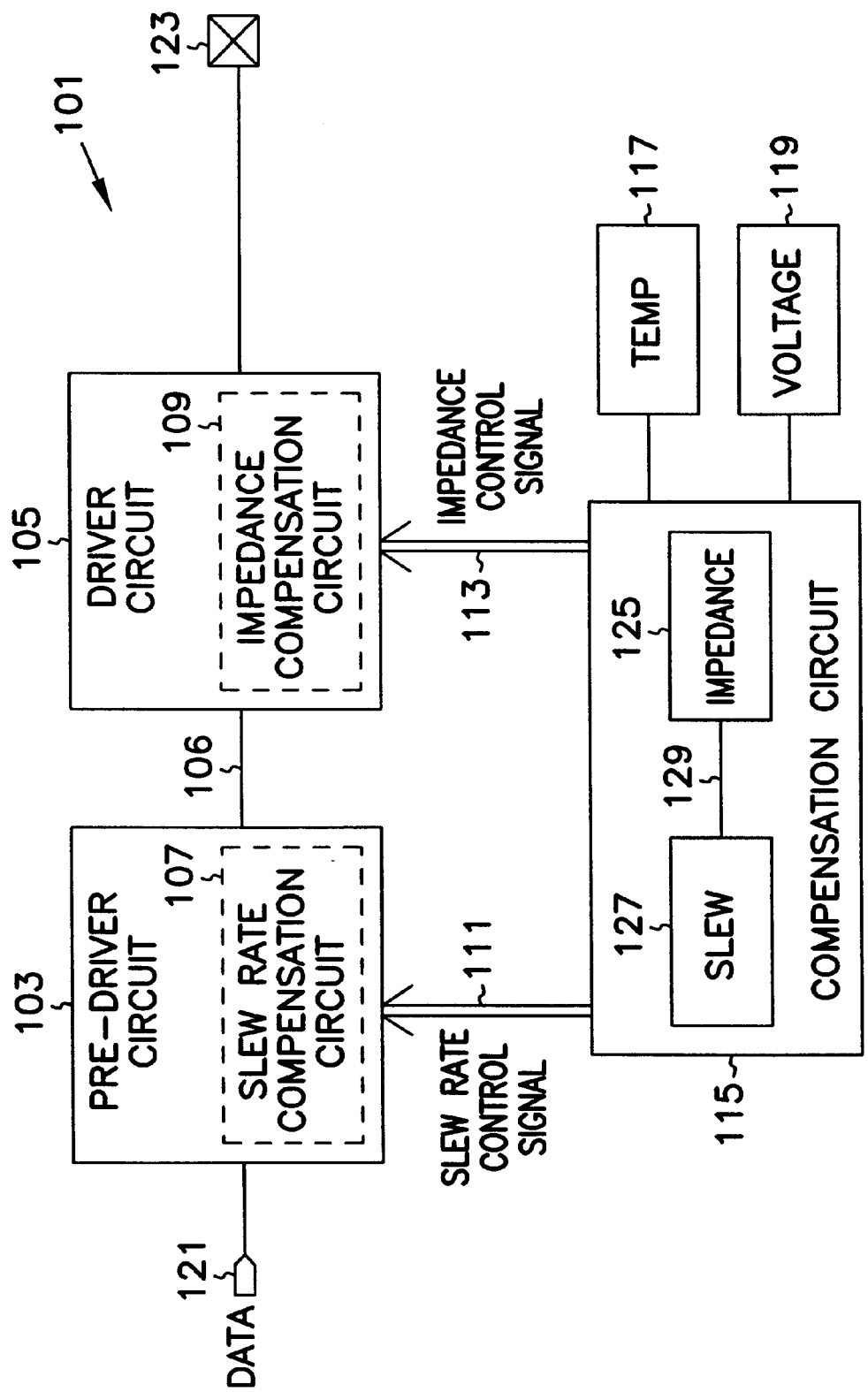
FIG. 1 is a block diagram of an output buffer according to an embodiment of the present invention.

FIG. 1 is a block diagram of an output buffer 101 according to an embodiment of the present invention. The output buffer 101 is fabricated in an integrated circuit chip, and includes a pre-driver circuit 103 coupled to a driver circuit 105 by a line 106. The pre-driver circuit 103 includes a slew rate compensation circuit 107, and the driver circuit 105 includes an impedance compensation circuit 109. A slew rate control signal is provided on a plurality of lines 111 and is received by the slew rate compensation circuit 107 in the pre-driver circuit 103 to modify a slew rate of the driver circuit 105. An impedance control signal is provided on a plurality of lines 113 received by the impedance compensation circuit 109 in the driver circuit 105 to compensate an output impedance of the driver circuit 105. The slew rate control signal and the impedance control signal are generated by a compensation circuit 115 which outputs the control signals on the appropriate lines 111, 113. A temperature detection circuit 117 detects a temperature of the output buffer 101 and provides a signal based on the temperature to the compensation circuit 115. A voltage detection circuit 119 detects a supply voltage provided to the output buffer 101 and provides a signal based on the supply voltage to the compensation circuit 115. When the output buffer 101 is operating a data signal is provided on a line 121 to the pre-driver circuit 103. The data signal is transferred to the driver circuit 105 over the line 106, and the driver circuit 105 drives the data signal on to a bus line (not shown) that is coupled to a pin 123.

The impedance control signal is generate in an impedance control signal generator 125 based on the temperature, the supply voltage, and the process skew of the chip to substantially reduce a difference between a characteristic impedance of the bus line and the output impedance of the driver circuit 105. The process skew of the chip is determined by the fabrication process parameters of the chip. The compensation of the output impedance substantially reduces signal reflection on the bus line. The slew rate control signal is generate in a slew rate control signal generator 127 in response to the temperature, the supply voltage, the process skew of the chip, and the impedance control signal which is provided to the generator 127 on a line 129. The slew rate compensation circuit 107 controls a slew rate of the data signal on the line 106 based on the slew rat control signal, and thereby controls the slew rate of the driver circuit 105 to be approximately uniform. The slew rate on the line 106 is determined by a product of the resistance of the pre-driver circuit 103 and a load capacitance $C_{LOAD}$ of the driver circuit 105 that is driven by the pre-driver circuit 103. $C_{LOAD}$ is determined by the impedance control signal, and will be described more fully below. The slew rate control signal compensates the resistance of the pre-driver circuit 103 in response to changes in CLOAD to keep the slew rate of the driver circuit approximately uniform. The slew rate control signal is generated in response to the impedance control signal and is therefore decoupled from the impedance control signal.

In one embodiment of the present invention, the slew rate control signal and the impedance control signal each comprise a plurality of digital signals. In another embodiment of the present invention, the impedance control signal is provided on the lines 113 to the driver circuit 105 from the compensation circuit 115, and is then coupled to the impedance compensation circuit 109.

Figure 2:
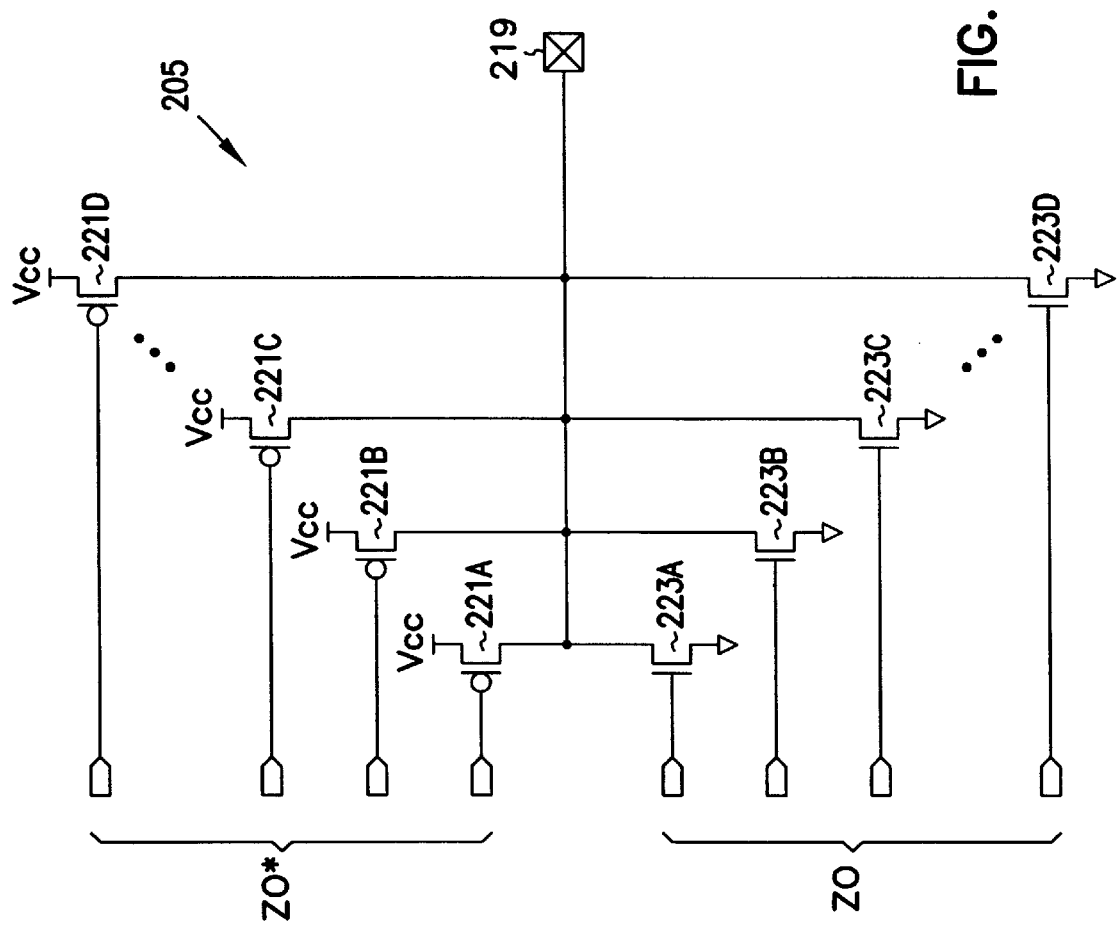
FIG. 2 is an electrical schematic diagram of a driver circuit according to an embodiment of the present invention.

The output impedance of the output buff 101 is determined by the driver circuit 105, and this is better described with reference to a driver circuit 205 according to an embodiment of the present invention. An electrical schematic diagram of the driver circuit 205 is shown in FIG. 2. The driver circuit 205 may be substituted for the driver circuit 105 in the output buffer 101 when, as mentioned above, the impedance control signal is provided to the pre-driver circuit 103. The driver circuit 205 includes a plurality of p-channel transistors 221A–D coupled in parallel between a pin 219 on a bus line (not shown) and a supply voltage Vcc. A plurality of n-channel transistors 223A–D are similarly coupled in parallel between the pin 219 and a ground.

The transistors 221A–D, 223A–D are controlled by the impedance control signal which comprises a first set of impedance control signals Z0* provided to control terminals of the respective p-channel transistors 221 A–D, and a second set of impedance control signals Z0 provided to control terminals of the respective n-channel transistors 223A–D. The signals Z0 are based on a 4-digit binary number Z0 where each digit corresponds to one of the signals Z0. If a digit is high the signal Z0 is high, and if a digit is low the signal Z0 is low. If Z0 is 1111 then all of the n-channel transistors 223A–D are switched on. If Z0 is 0000 then all of the n-channel transistors 223A–D are switched off. If Z0 is another number, such as 1010, then the corresponding n-channel transistors 223A–D are switched on or off. The signals Z0* are the inverse of the signals Z0 and control the p-channel transistors 221A–D in a similar manner. The signals Z0 and Z0* are generated by the compensation circuit 115 shown in FIG. 1 either directly or indirectly through another set of signals.

The driver circuit 205 drives a high signal on to the bus line through the pin 219 when one or more of the p-channel transistors 221A–D are switched on to couple the pin 219 to Vcc and the n-channel transistors 223A–D are all switched off. The output impedance of the driver circuit 205 is determined by the number of p-channel transistors 221A–D that are switched on. If the output impedance of the driver circuit 205 needs to be decreased, then more p-channel transistors 221A–D may be switched on. If the output impedance of the driver circuit 205 needs to be increased, then fewer p-channel transistors 221A–D may be switched on.

The driver circuit 205 drives a low signal on to the bus line through the pin 219 when one or more of the n-channel transistors 223A–D are switched on to couple the pin 219 to ground and the p-channel transistors 221A–D are all switched off. The output impedance of the driver circuit 205 is determined by the number of n-channel transistors 223A–D that are switched on. If the output impedance of the driver circuit 205 needs to be decreased, then more n-channel transistors 223A–D may be switched on. If the output impedance of the driver circuit 205 needs to be increased, then fewer n-channel transistors 223A–D may be switched on.

The signals Z0, Z0* determine the signal at the pin 219. In addition, the output impedance of the driver circuit 205 may be adjusted through the signals Z0, Z0* to substantially reduce a difference between the output impedance and the characteristic impedance of the bus line connected to the pin 219 as the supply voltage and the temperature of the driver circuit 205 fluctuate, and to compensate for the process skew of the chip.

The p-channel transistors 221A–D and the n-channel transistors 223A–D are large power transistors that each have a large gate capacitance. The gate capacitances of the activated transistors 221A–D, 223A–D comprise the load capacitance CLOAD of the driver circuit 205 that is driven by the pre-driver circuit 103. In other words, CLOAD is the cumulative capacitance of the gates of the transistors 221 A–D, 223A–D that are being switched on and off by the pre-driver circuit 103. As discussed above, $C_{LOAD}$ affects the slew rate of the driver circuit 205. $C_{LOAD}$ changes according to the signals Z0, Z0* as the compensation circuit adjusts the output impedance of the driver circuit 205.

In an alternative embodiment of the present invention, there may be more than four p-channel transistors 221 connected in parallel and more than four n-channel transistors 223 connected in parallel, and a corresponding increase in the number of signals Z0 and Z0*. In another embodiment of the present invention, the impedances of the p-channel transistors 221A–D and the n-channel transistors 223A–D are not equal. In particular, the impedance of the p-channel transistors 221 A–D may be binary-weighted and the impedance of the n-channel transistors 223A–D may be binary-weighted to a different weight to optimize the control of the output impedance of the driver circuit 205.

Figure 3:
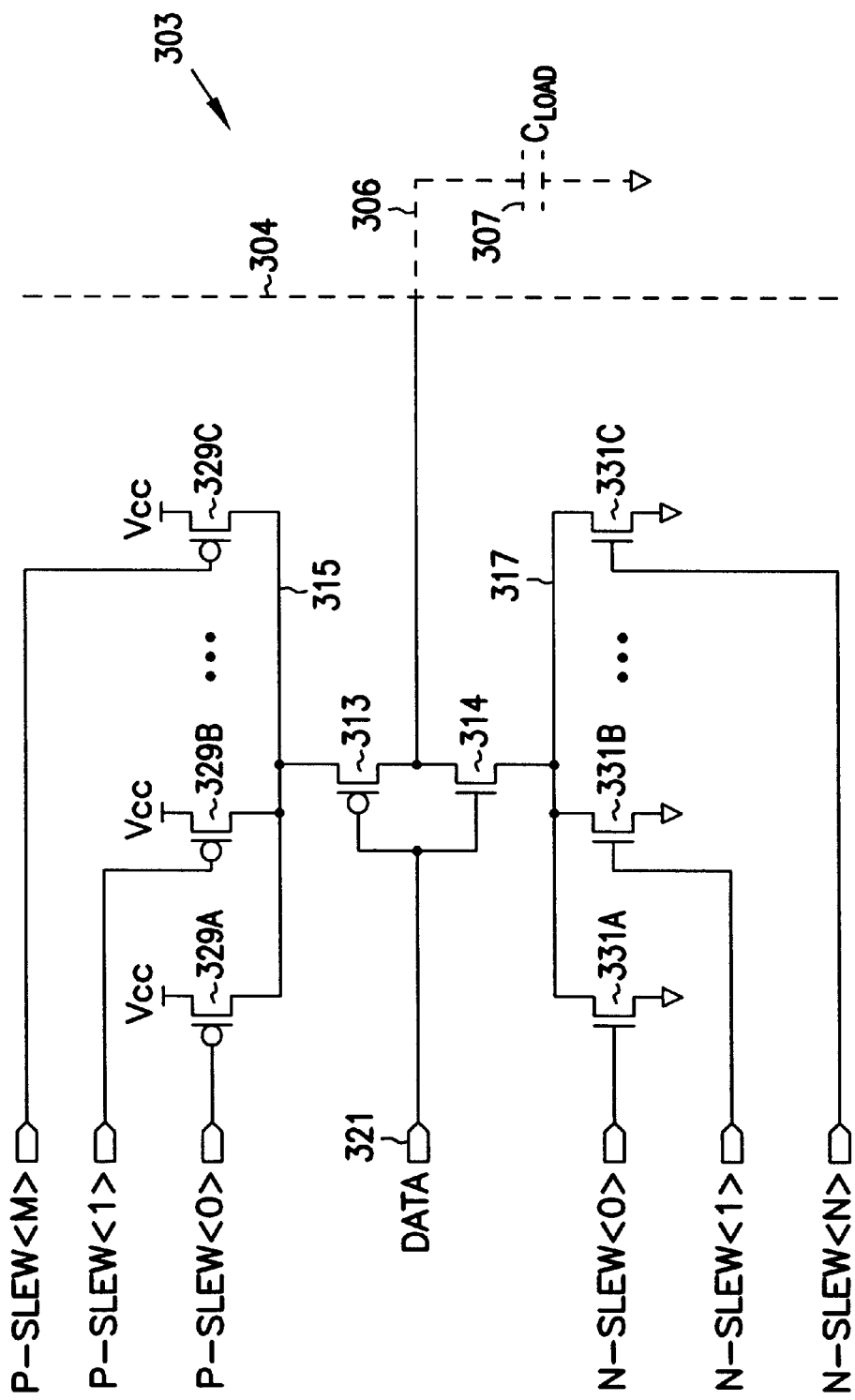
FIG. 3 is an electrical schematic diagram of a pre-driver circuit according to an embodiment of the present invention.

An electrical schematic diagram of a pre-driver circuit 303 is shown in FIG. 3 according to an embodiment of the present invention. The pre-driver circuit 303 may be substituted for the pre-driver circuit 103 shown in FIG. 1. The pre-driver circuit 303 is shown to the left of a dashed line 304, and outputs a data signal on a line 306 to the driver circuit 105 (not shown). The line 306 is coupled to a capacitor 307 shown in dashed lines and representing $C_{LOAD}$.

The pre-driver circuit 303 includes an inverter with a p-channel transistor 313 connected in series with an n-channel transistor 314. The inverter is coupled between two rails 315 and 317. Gates of the p-channel transistor 313 and the n-channel transistor 314 are coupled to receive a data signal from a line 321, and an inverted data signal is generated between the transistors 313, 314 on the line 306 to be provided to the driver circuit 105.

The pre-driver circuit 303 includes slew rate compensation circuitry including a plurality of p-channel transistors 329A–C coupled in parallel between a supply voltage Vcc and the rail 315. A plurality of n-channel transistors 331A–C is coupled in parallel between the rail 317 and a ground. A slew rate control signal is generated by the slew rate control signal generator 127 shown in FIG. 1 as a set of digital slew rate control signals P-SLEW <0:M> and N-SLEW <0:N>. The signals P-SLEW<0:M> are coupled respectively to the gates of the p-channel transistors 329A–C, and the signals N-SLEW<0:N> are coupled respectively to the gates of the n-channel transistors 331A–C. The p-channel transistors 329A–C provide a variable resistance between the rail 315 and the voltage Vcc in response to the signals P-SLEW<0:M>, and the n-channel transistors 331A–C provide a variable resistance between the rail 317 and ground in response to the signals N-SLEW<O:N>. The transistors 329A–C, 331A–C provide a resistance R to a charging of $C_{LOAD}$ and a discharge of $C_{LOAD}$ when the data signal transitions from high to low or low to high. The resistance R is determined by the signals P-SLEW<0:M> and N-SLEW<0:N>. As discussed above, a product of R and $C_{LOAD}$ determines the slew rate of the driver circuit 205.

When the pre-driver circuit 303 is in operation, if it is desired to decrease the resistance between the voltage Vcc and the rail 315, then more p-channel transistors 329A–C can be switched on with the signals P-SLEW<0:M>. If it is desired to increase the resistance between the voltage Vcc and the rail 315, then fewer p-channel transistors 329A–C can be switched on with the signals P-SLEW<0:M>. Similarly, if it is desired to decrease the resistance between the rail 317 and ground, then more n-channel transistors 331 A–C can be switched on with the signals N-SLEW<0:N>. If it is desired to increase the resistance between the rail 317 and ground, then fewer n-channel transistors 331 A–C can be switched on with the signals N-SLEW<0:N>.

As discussed above, $C_{LOAD}$ changes according to the number of transistors in the driver circuit 105 or 205 that are switched on an off. The signals Z0, Z0* are generated by the impedance control signal generator 125 to control the transistors in the driver circuit 105 to maintain the output impedance of the output buffer 101 at a desired level as the temperature and Vcc change. The signals P-SLEW <0:M> and NSLEW <0:N> are generated by the slew rate control signal generator 127 in response to the signals Z0, Z0* to compensate R and maintain the product of R and CLOAD to be approximately uniform as $C_{LOAD}$ changes. The slew rate of the output buffer 101 is thereby controlled to be approximately uniform during changes in the temperature, Vcc, and the output impedance, and the slew rate is compensated for the process skew of the chip to support rapid communication on the bus coupled to the pin 123 of the output buffer 101.

When switched on the transistors 313, 314, 329A–C, 331A–C each have a resistance that will change with a change in the temperature of the pre-driver circuit 303, or a change in Vcc. One skilled in the art with the benefit of the present description will understand that the signals P-SLEW<0:M> and N-SLEW<0:N> may be generated by the slew rate control signal generator 127 to compensate for these changes.

Figure 4:
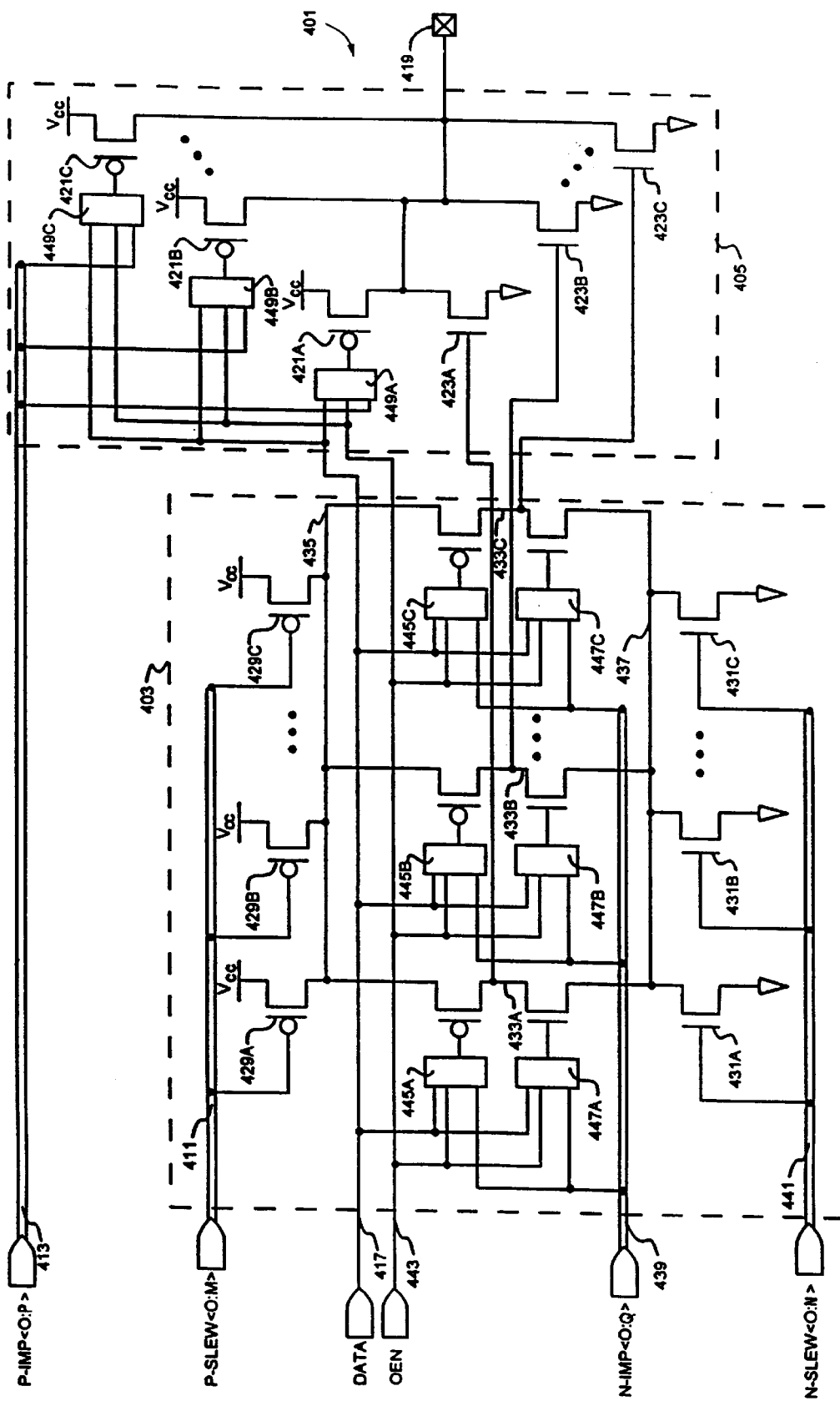
FIG. 4 is an electrical schematic diagram of an output buffer according to an embodiment of the present invention.

An electrical schematic diagram of an output buffer 401 is shown in FIG. 4 according to an embodiment of the present invention. The output buffer 401 includes a pre-driver circuit 403 and a driver circuit 405 and may be substituted for the corresponding pre-driver circuit 103 and driver circuit 105 shown in FIG. 1. The driver circuit 405 is similar to the driver circuit 205 shown in FIG. 2. The driver circuit 405 includes a plurality of p-channel transistors 421A–C coupled in parallel between a pin 419 coupled to a bus line (not shown) and a supply voltage Vcc. A plurality of n-channel transistors 423A–C are similarly coupled in parallel between the pin 219 and a ground.

The pre-driver circuit 403 is similar to the pre-driver circuit 303 shown in FIG. 3, and includes a plurality of inverters 433A–C coupled in parallel between two rails 435 and 437. A plurality of p-channel transistors 429A–C are coupled in parallel between the rail 435 and Vcc, and a plurality of n-channel transistors 431 A–C are coupled in parallel between the rail 437 and ground. The p-channel transistors 429A–C are controlled by respective slew rate control signals P-SLEW<0:M> and the n-channel transistors 431 A–C are controlled by respective slew rate control signals N-SLEW<0:N>. The inverters 433A–C share the transistors 429A–C, 431A–C, and therefore the number of devices required in the output buffer 401 is reduced, and the amount of integrated circuit area and power required to implement the output buffer 401 is reduced.

An output enable signal OEN and a data signal DATA are received by the output buffer 401 on respective lines 443, 417. The signal OEN indicates when the data signal DATA is valid. The data signal DATA and the signal OEN are each received in logic circuits 445A–C and 447A–C respectively connected to gates of transistors in the inverters 433A–C. The data signal DATA and the signal OEN are also received in logic circuits 449A–C respectively connected to gates of the p-channel transistors 421 A–C in the driver circuit 405. The logic circuits 445A–C, 447A–C, and 449A–C sample the data signal DATA when the signal OEN is enabled and ignore the data signal DATA when the signal OEN is disabled.

The p-channel transistors 421A–C in the driver circuit 405 provide a termination for the line at the pin 419 when the n-channel transistors 423A–C are switched off to improve signal quality during a transition from low to high on the line. The slew rate on the line is controlled through the n-channel transistors 423A–C. The logic circuits 449A–C buffer gates of the p-channel transistors 421 A–C from the pre-driver circuit 403, so they do not contribute to the load capacitance $C_{LOAD}$ of the driver circuit 405, and they are not coupled to receive a slew rate control signal.

In alternative embodiments of the invention the p-channel transistors 421 A–C may be used to control the slew rate on the line at the pin 419.

Impedance control signals Z0, Z0* (not shown) are generated by a circuit such as the impedance control signal generator 125 shown in FIG. 1, and are converted to signals P-IMP<0:P> and N-IMP<0:Q> provided to the output buffer 401 to control the output impedance of the driver circuit 405. The signals P-IMP<0:P> and N-IMP<0:Q> are generated based on the temperature of the output buffer 401 and the voltage Vcc to substantially reduce a difference between the output impedance of the driver circuit 405 and the characteristic impedance of the line coupled to the pin 419. The signals P-IMP<0:P> and N-IMP<0:Q> are also generated to compensate for the process skew of a chip including the output buffer 401.

The output buffer 401 is operated to transfer the data signal DATA to the pin 419 in the following manner. The signals P-IMP<0:P> are received respectively by the logic circuits 449A–C to control the p-channel transistors 421A–C. Selected ones of the p-channel transistors 421A–C are enabled by the signals P-IMP<0:P> and are switched on by the data signal DATA when the signal OEN is enabled. As discussed above, the p-channel transistors 421A–C provide primarily a regulated output impedance for the driver circuit 405 according to the signals P-IMP<0:P>, and are not controlled to regulate the slew rate. The signals N-IMP<0:Q> are received respectively in the logic circuits 445A–C and 447A–C, and selected ones of the inverters 433A–C are enabled by the signals N-IMP<0:Q> to invert the data signal DATA and pass the inverted signal to gates of the n-channel transistors 423A–C when the signal OEN is enabled. The output impedance of the driver circuit 405 is compensated by the signals P-IMP<0:P>, N-IMP<0:Q> based on changes in the temperature of the output buffer 401, changes in Vcc, and the process skew of the chip. The slew rate of the driver circuit 405 is regulated by the signals P-SLEW<0:M> and N-SLEW<0:N> controlling a resistance R of the pre-driver circuit 403 through the transistors 429A–C, 431A–C. A load capacitance $C_{LOAD}$ of the driver circuit 405 is determined by the signals N-IMP<0:Q>, and changes with changes in those signals. The signals P-SLEW<0:M> and N-SLEW<0:N> are generated in response to changes in the signals N-IMP<0:Q> to maintain an approximately uniform slew rate for the output buffer 401.

Figure 5:
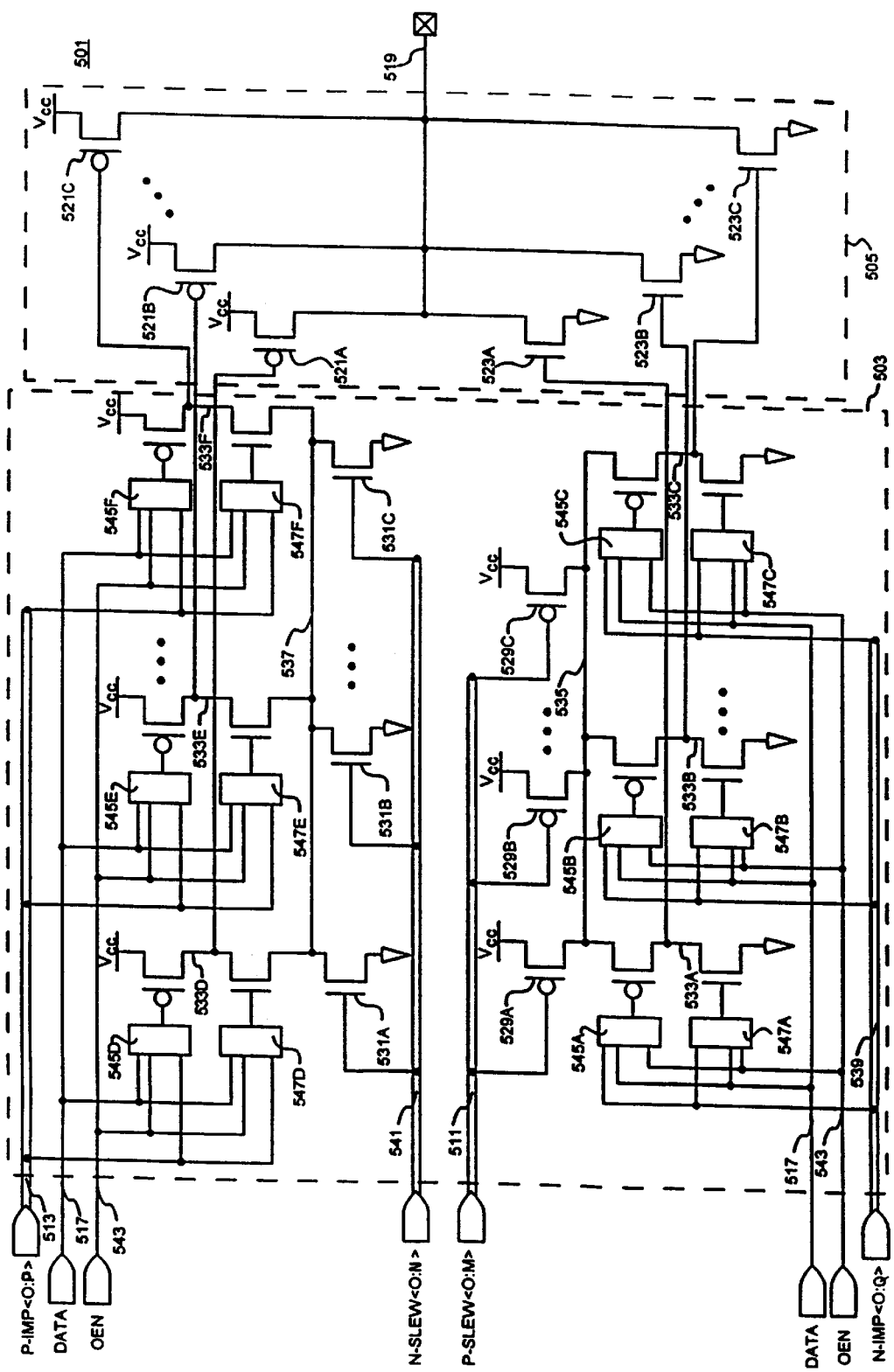
FIG. 5 is an electrical schematic diagram of an output buffer according to an embodiment of the present invention.

An electrical schematic diagram of an output buffer 501 is shown in FIG. 5 according to an embodiment of the present invention. The output buffer 501 includes a pre-driver circuit 503 and a driver circuit 505 and may be substituted for the corresponding pre-driver circuit 103 and driver circuit 105 shown in FIG. 1. The driver circuit 505 is similar to the driver circuit 205 shown in FIG. 2, and includes a plurality of p-channel transistors 521A–C coupled in parallel between a pin 519 on a bus line (not shown) and a supply voltage Vcc. A plurality of n-channel transistors 523A–C are similarly coupled in parallel between the pin 519 and a ground. Unlike the output buffer 401 shown in FIG. 4, all of the transistors 521A–C, 523A–C are power transistors capable of driving a signal on to the line. In one embodiment of the present invention, the p-channel transistors 521A–C and the n-channel transistors 523A–C are binary-weighted. In another embodiment of the present invention, the p-channel transistors 521 A–C and the n-channel transistors 523A–C are equally weighted.

The pre-driver circuit 503 of the output buffer 501 includes a plurality of inverters 533A–F, each of which are coupled to a gate of a corresponding one of the p-channel transistors 521 A–C and the n-channel transistors 523A–C in the driver circuit 505. The inverters 533A–F receive signals DATA, OEM, P-IMP<0:P>, and N-IMP<0:Q>, similar to the corresponding signals described above with respect to the output buffer 401, through a plurality of logic circuits 545A–F, 547A–F that control the inverters 533A–F to pass the signal DATA to the p-channel transistors 521A–C and the n-channel transistors 523A–C.

The slew rate of the driver circuit 505 is controlled by slew rate control signals N-SLEW<0:N> coupled to a plurality of n-channel transistors 531A–C connected in parallel between ground and a rail 537, and by slew rate control signals P-SLEW<0:M> coupled to a plurality of p-channel transistors 529A–C connected in parallel between a supply voltage Vcc and a rail 535. The slew rate is controlled only when the transistors 521A–C, 523A–C are being switched on. The slew rate is not limited when the transistors 521A–C, 523A–C are being switched off because when the data signal at the pin 519 is in transition the activated transistors are switched off before other transistors are switched on, and this does not substantially influence the slew rate. The timing of the transistors being switched on is more significant in determining the slew rate. One skilled in the art with the benefit of the present description will understand that the operation of the output buffer 501 is analogous to the operation of the output buffer 401 shown in FIG. 4, and this will not be described for purposes of brevity.

Figure 6:
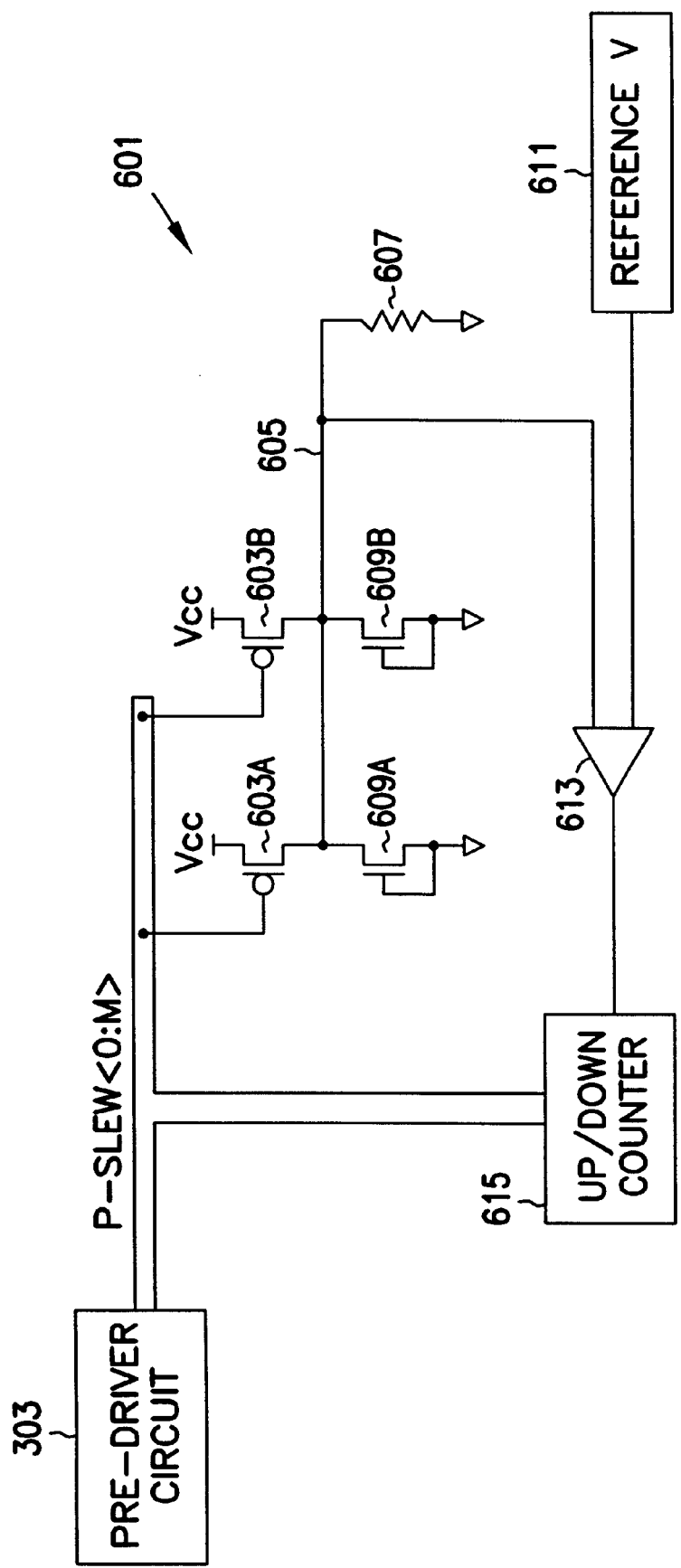
FIG. 6 is an electrical schematic diagram of a feedback circuit according to an embodiment of the present invention.

The slew rate control signals N-SLEW and P-SLEW are generated by the slew rate control signal generator 127 shown in FIG. 1. Circuitry for generating these signals will now be described. A feedback circuit 601 is shown in FIG. 6 according to an embodiment of the present invention. The circuit 601 includes a plurality of p-channel transistors 603A–B connected in parallel between a supply voltage Vcc and a rail 605 that are coupled to receive the signals P-SLEW<O:M> at respective gate terminals. A precision resistor 607 is connected in parallel with a plurality of n-channel transistors 609A–B between the rail 605 and a ground. Gates of the transistors 609A–B are connected to ground to render the transistors 609A–B non-conductive. The p-channel transistors 603A–B are similar to the corresponding p-channel transistors in the pre-driver circuits 303, 403, 503 shown above and are activated by the signals P-SLEW<0:M> to regulate a voltage on the rail 605 to be equal to a reference voltage provided by a reference voltage generator 611. One skilled in the art with the benefit of the present description will recognize that M+1 p-channel transistors 603, one for each signal P-SLEW<0:M>, may be connected in parallel to regulate the voltage on the rail 605. The reference voltage and the voltage on the rail 605 are compared in a comparator 613 having an output coupled to an up/down counter 615. The up/down counter generates the signals P-SLEW<0:M> to render selected ones of the p-channel transistors 603A–B conductive such that the voltage on the rail 605 is equal to the reference voltage. The signals P-SLEW<0:M> are also provided on a plurality of lines to the pre-driver circuit 103 shown in FIG. 1 to regulate a resistance R of the pre-driver circuit 103.

Figure 7:
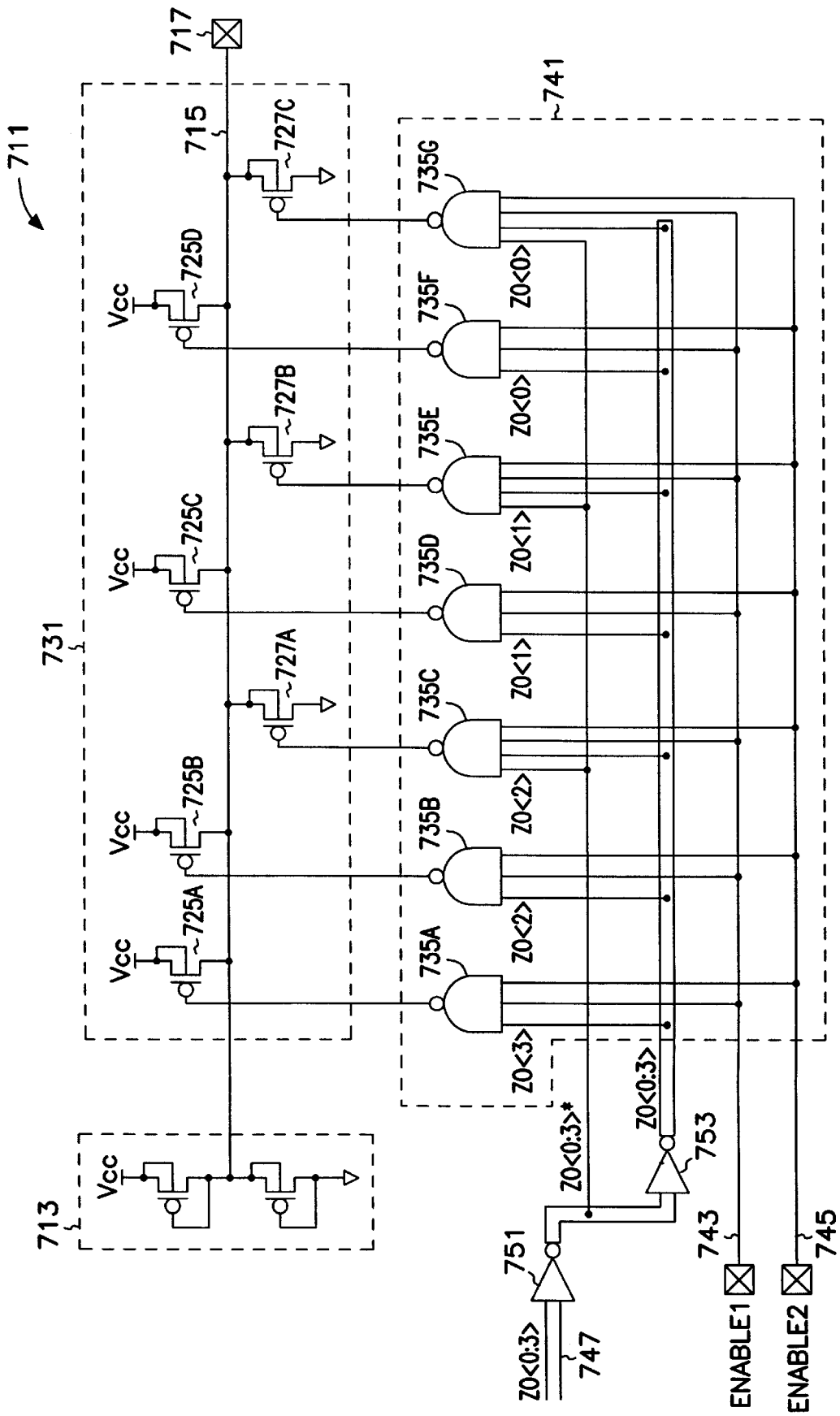
FIG. 7 is an electrical schematic diagram of a reference voltage generator according to an embodiment of the present invention.

The reference voltage is selected and regulated by the reference voltage generator 611 based on the impedance control signals Z0, which, as in the embodiments of the present invention described above, correspond to a 4-digit binary number Z0 that is generated in the impedance control signal generator 125. The signals Z0 determine which of the transistors in the driver circuits 105, 205, 405, 505 are switched on and determines $C_{LOAD}$ of the driver circuits 105, 205, 405, 505. An electrical schematic diagram of a reference voltage generator 711 is shown in FIG. 7 according to an embodiment of the present invention. The generator 711 may be substituted for the generator 611 shown in FIG. 6.

The generator 711 includes a voltage divider 713 that provides a voltage midway between Vcc and ground to a line 715 connected to a terminal 717. The voltage on the line 715 is modified by a set of p-channel pull-up transistors 725A–D connected in parallel between Vcc and the line 715, and a set of p-channel pull-down transistors 727A–C connected in parallel between the line 715 and ground. The transistors 725A–D, 727A–C have body terminals connected to their sources and comprise a pull-up/pull-down circuit 731. The transistors 725A–D, 727A–C each have a gate terminal connected to an output of a respective NAND gate 735A–G in a logic circuit 741. The NAND gates 735A–G each have several inputs, two of which are connected to receive respective enabling signals ENABLE1, ENABLE2 on lines 743, 745 that are each high when the generator 711 is operating. The signals Z0<0:3> are received on a plurality of lines 747, and are inverted twice by two inverters 751, 753 before being provided respectively to the NAND gates 735A–G as shown in FIG. 7. A signal Z0<3>*, which is inverted from the signal Z0<3> in the inverter 751, is provided as a separate input to the NAND gates 735C,E,G.

The generator 711 is operated to provide a reference voltage on the line 715 according to Table 1:

TABLE 1

| Z0 | Reference Voltage |
|---|---|
| 1000 | 0.574 * Vcc |
| 1001 | 0.595 * Vcc |
| 1010 | 0.609 * Vcc |
| 1011 | 0.649 * Vcc |
| 1100 | 0.667 * Vcc |
| 1101 | 0.697 * Vcc |
| 1110 | 0.713 * Vcc |
| 1111 | 0.742 * Vcc |

Shown in Table 1 are the 4-digit number Z0 and the corresponding reference voltage. The 4 digits of the number Z0 correspond to the number of transistors switched on in the driver circuit 105, and to the signals Z0<0:3> provided on the lines 747. Each of the NAND gates 735A–G switches on its respective transistor 725A–D, 727A–C when all of its inputs are high. The signals ENABLE1, ENABLE2 are high when the generator 711 is in operation such that the signals Z0<0:3> determine which combination of the transistors 725A–D, 727A–C are switched on to generate the reference voltage pattern shown in Table 1. As Z0 increases the reference voltage increases. When Z0 is 1000 or higher as shown in Table 1 Z0<3>* is 0 and the transistors 727A–C are disabled.

In alternative embodiments of the present invention the reference voltages shown in Table 1 will be different. In addition, in alternative embodiments of the present invention Z0 may be 0111 or lower and the reference voltage may be scaled down accordingly.

The operation of the circuit 601 and the generator 711 shown in FIGS. 6,7 will now be described. As shown when Z0 gets progressively higher, from 1000 to 1, more transistors in the driver circuit 105, 205, 405, 505 are switched on and CLOAD increases, and the reference voltage on the line 715 increases as well. In the circuit 601 the comparator 613 and the up/down counter 615 form a feedback loop that reduces a difference between the voltage on the rail 605 and the reference voltage. The up/down counter changes more of the signals P-SLEW<O:M> to 0 so that more of the p-channel transistors 603A–B are switched on to reduce a resistance between Vcc and the rail 605 and to raise the voltage on the rail 605 to meet the reference voltage. The signals P-SLEW<0:M> also switch on more p-channel transistors in the pre-driver circuit 103, 303, 403, 503 to reduce the resistance R and maintain an approximately uniform slew rate with an approximately uniform product of R and $C_{LOAD}$. The circuit 601 and the generator 711 operate in an opposite manner when Z0 progresses from 1111 to 1000.

Figure 8:
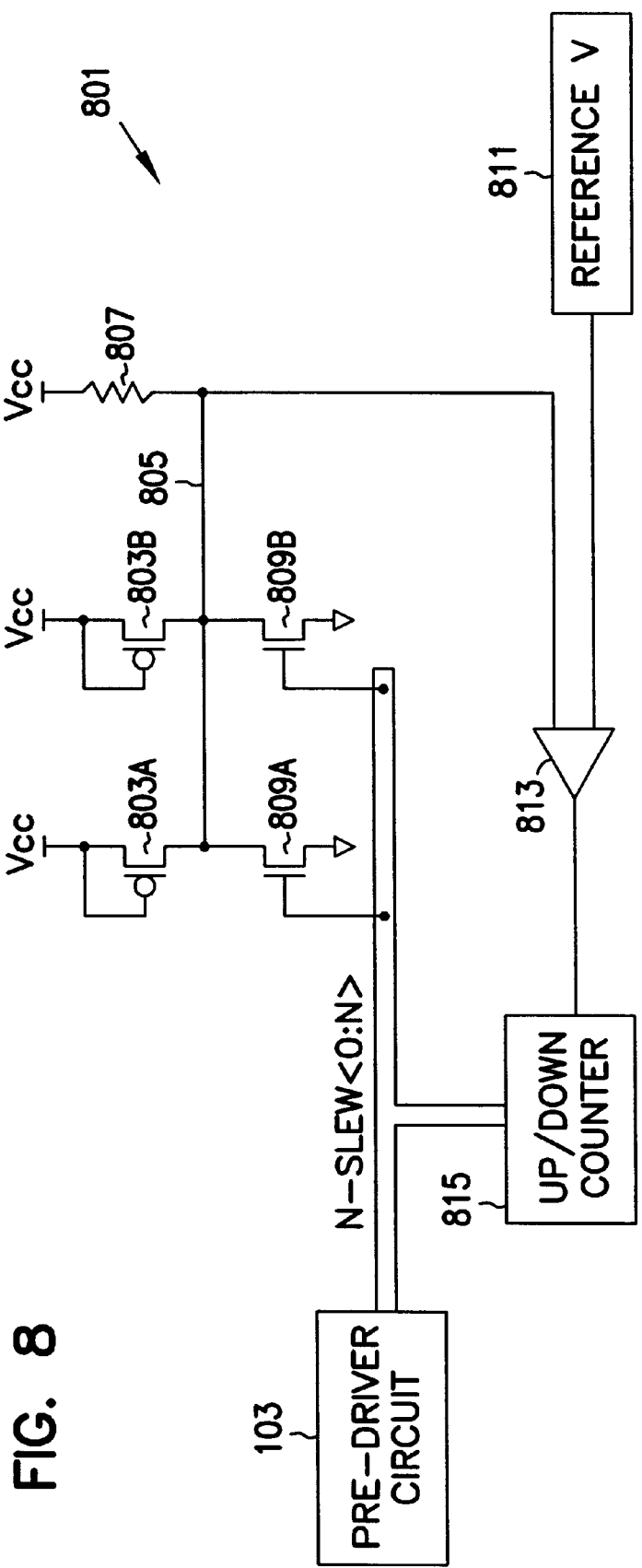
FIG. 8 is an electrical schematic diagram of a feedback circuit according to an embodiment of the present invention.

The signals P-SLEW<0:M> are generated by the feedback circuit 601 shown in FIG. 6, and a corresponding feedback circuit 801 for generating the signals N-SLEW<0:N> is shown in FIG. 8 according to another embodiment of the present invention. A plurality of p-channel transistors 803A–B are connected in parallel between Vcc and a rail 805 to be non-conductive, and a precision resistor 807 is connected in parallel with the transistors 803A–B between Vcc and the rail 805. A plurality of n-channel transistors 809A–B are connected in parallel between the rail 805 and ground to regulate a voltage on the rail 805 based on the signals N-SLEW<0:N> that are coupled to their respective gates. One skilled in the art with the benefit of the present description will recognize that N+1 n-channel transistors 809 may be connected in parallel to regulate the voltage on the rail 805. The voltage on the rail 805 is modified to be approximately equal to a reference voltage from a reference voltage generator 811 similar to the reference voltage generator 711 shown in FIG. 7. A comparator 813 compares the reference voltage with the voltage on the rail 805, and provides an output to an up/down counter 815 that generates the signals N-SLEW<0:N>. The signals N-SLEW<0:N> are also provided on a plurality of lines to the pre-driver circuit 103 shown in FIG. 1. The operation of the circuit 801 is analogous to the operation of the circuit 601 and will not be described herein for purposes of brevity.

One skilled in the art with the benefit of the present description will understand that the circuits 601, 801, and the generator 711 generate the signals N-SLEW<0:N> and P-SLEW<0:M> in response to the signals Z0,Z0* to maintain an approximately uniform slew rate with an approximately uniform product of R and $C_{LOAD}$. The generation of the signals N-SLEW<0:N> and P-SLEW<0:M> is decoupled from the generation of the signals Z0,Z0*.

Figure 9:
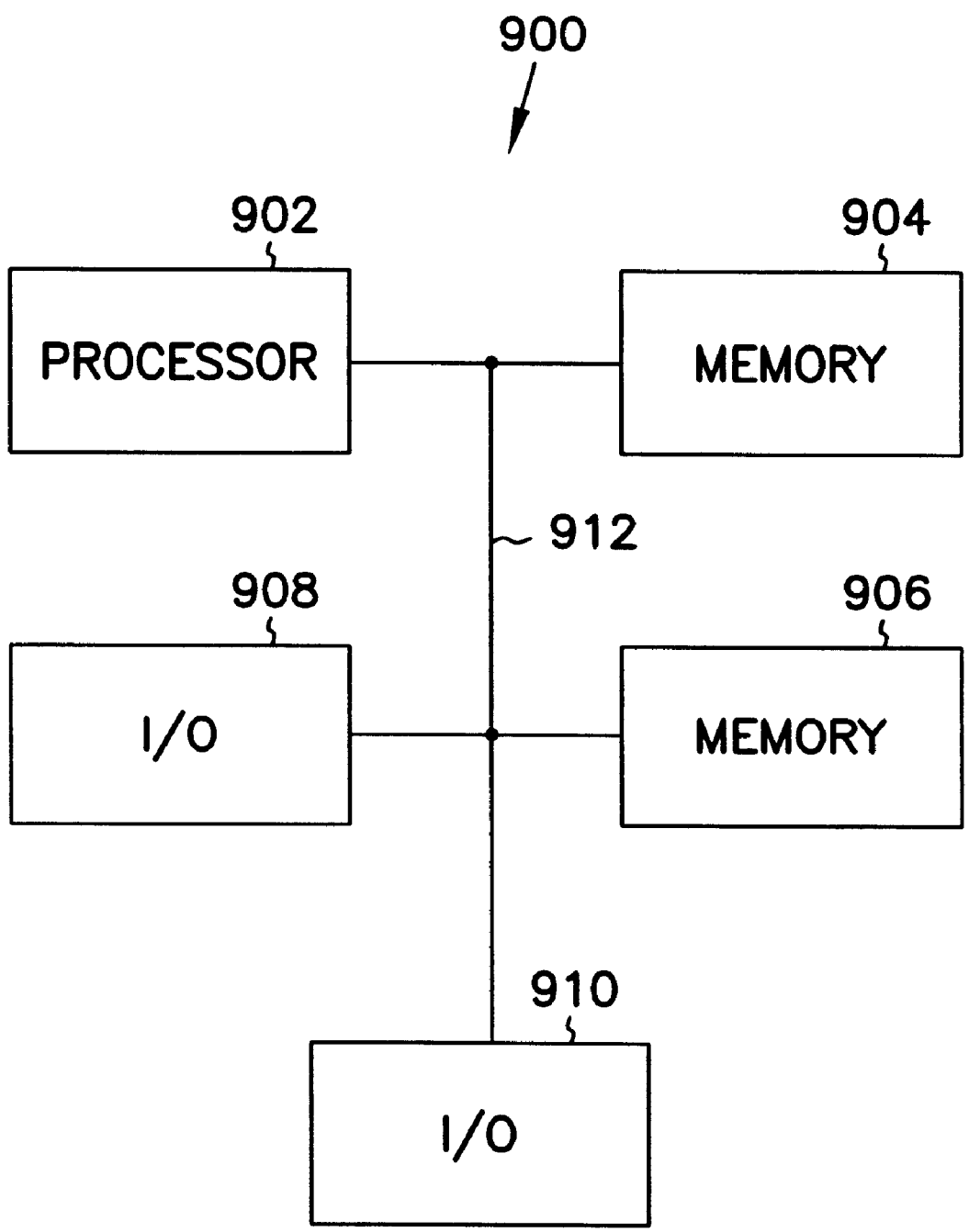
FIG. 9 is a block diagram of a computer system according to an embodiment of the present invention.

An output buffer according to any one of the embodiments of the present invention described above may be included in a computer system such as a computer system 900 according to an embodiment of the present invention and shown in a block diagram in FIG. 9. The computer system 900 includes a processor 902, two memory devices 904, 906, and two input/output (I/O) devices 908, 910. Each of the memory devices 904, 906 is either a random-access memory (RAM), a read-only memory (ROM), a cache memory, or a storage device such as a hard disk drive, a floppy disk drive, an optical disk drive, or a tape cartridge drive. Each of the I/O devices 908, 910 is either a monitor, a pointing device such as a mouse, a keyboard, or a modem. The devices in the computer system 900 including the processor 902, the two memory devices 904, 906, and the two I/O devices 908, 910 communicate with each other through a bus 912 connected to the devices, and the output buffer may be included in one or more of the devices to drive a signal on to a line in the bus. One skilled in the art with the benefit of the present description will recognize that more devices such as processors, memory circuits, and I/O devices may be connected to the bus 912. The output buffer may also be included in one of the devices to drive a signal on a line between two functional circuits in the device.

Those skilled in the art with the benefit of the present description can appreciate that the present invention may be practiced with any computerized system including, for example, a video game, a hand-held calculator, a personal computer, or a multi-processor supercomputer, or an information appliance such as, for example, a cellular telephone, a pager, or a daily planner or organizer, or an information component such as, for example, a magnetic disk drive or telecommunications modem, or other appliance such as, for example, a hearing aid, washing machine or microwave oven having an electronic controller.

Figure 10:
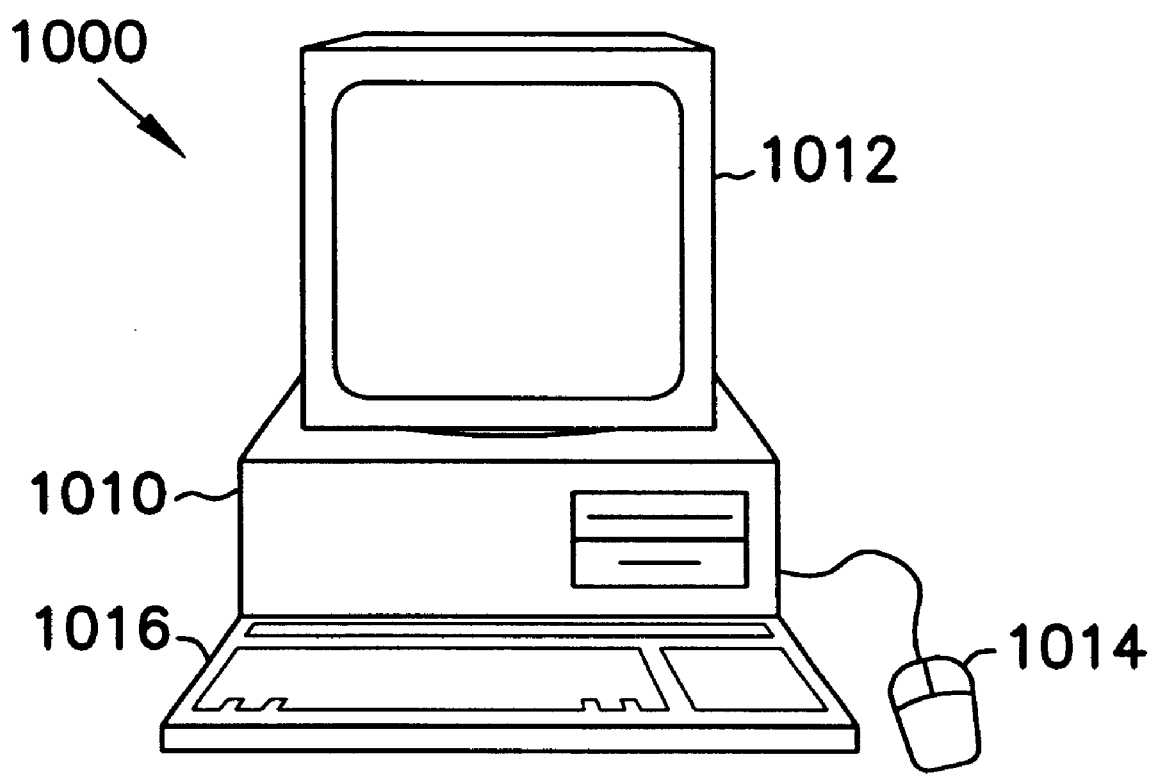
FIG. 10 is a block diagram of a personal computer according to an embodiment of the present invention.

The computer system 900 shown in FIG. 9 may take the form of a personal computer 1000 shown in FIG. 10. The personal computer 1000 includes a computer 1010 that is operatively coupled to a monitor 1012, a pointing device 1014, and a keyboard 1016. The computer 1010 includes a processor, a random-access memory (RAM), a read-only memory (ROM), and one or more storage devices, such as a hard disk drive, a floppy disk drive (into which a floppy disk can be inserted), an optical disk drive, and a tape cartridge drive. The memory, hard drives, floppy disks, etc., are types of computer-readable media. The present invention is not particularly limited to one type of computer 1010. The monitor 1012 permits the display of information within a viewing area, including computer, video and other information, for viewing by a user of the personal computer 1000. The present invention is not limited to any particular monitor 1012, and the monitor 1012 is one type of display device that may be used in a system with the present invention. Such monitors include cathode ray tube (CRT) displays, as well as flat panel displays such as liquid crystal displays (LCD's). The pointing device 1014 permits a control of the screen pointer provided by graphical user interfaces. The present invention is not limited to any particular pointing device 1014. Such pointing devices include mouses, touch pads, trackballs, wheels, remote controls and point sticks. Finally, the keyboard 1016 permits entry of textual information into the computer 1010, as known within the art, and the present invention is not limited to any particular type of keyboard.

Although specific embodiments have been illustrated and described herein, it will be appreciated by those skilled in the art with the benefit of the present description that any arrangement which is calculated to achieve the same purpose may be substituted for the specific embodiments shown. The present invention is therefore limited only by the claims and equivalents thereof.

What is claimed is:

1. An output buffer comprising:
    a driver circuit having an impedance that is controlled by an impedance control signal; and
    a pre-driver circuit to control a slew rate of the driver circuit according to a slew rate control signal that is generated in response to the impedance control signal.

2. The output buffer of claim 1, further comprising a compensation circuit to generate the impedance control signal to control the impedance of the driver circuit, the pre-driver circuit having elements to control the slew rate of the driver circuit to be approximately uniform during changes in the impedance of the driver circuit.

3. The output buffer of claim 1 wherein:
    the driver circuit includes an input capacitance dependent on the impedance of the driver circuit; and
    the pre-driver circuit includes elements to control the slew rate of the driver circuit based on the input capacitance of the driver circuit.

4. The output buffer of claim 3 wherein:
    the driver circuit includes an input and an output terminal connected to a line to drive a data signal on to the line; and
    the pre-driver circuit has an output coupled to the input of the driver circuit to provide the data signal to the driver circuit, the pre-driver circuit including elements to adjust a slew rate of the data signal at the input of the driver circuit to control a slew rate of the data signal at the output terminal.

5. The output buffer of claim 4 wherein the driver circuit comprises:
    a plurality of p-channel transistors connected in parallel between a first voltage reference and the output terminal, each p-channel transistor having a control terminal coupled to the output of the pre-driver circuit to receive a control signal based on the data signal;
    a plurality of n-channel transistors connected in parallel between the output terminal and a second voltage reference, each n-channel transistor having a control terminal coupled to the output of the pre-driver circuit to receive a control signal based on the data signal; and
    wherein the impedance of the driver circuit is determined by a number of the p-channel transistors or the n-channel transistors that are switched on and the input capacitance of the driver circuit is determined by the control terminals of the p-channel transistors or the n-channel transistors that are switched on.

6. The output buffer of claim 4 wherein the pre-driver circuit comprises:
a plurality of inverters coupled in parallel between a first rail and a second rail, each inverter having an input coupled to receive the data signal and an output coupled to provide an inverted data signal to a control terminal of a transistor in the driver circuit;
a plurality of first transistors coupled in parallel between a first voltage reference and the first rail, each of the first transistors having a control terminal coupled to receive a first pre-driver signal to control a state of the first transistor; and
a plurality of second transistors coupled in parallel between a second voltage reference and the second rail, each of the second transistors having a control terminal coupled to receive a second pre-driver signal to control a state of the second transistor.

7. The output buffer of claim 4, further comprising:
a temperature detection circuit to detect a temperature of the output buffer;
a voltage detection circuit to detect a supply voltage of the output buffer;
a compensation circuit comprising:
   an impedance control signal generator to generate the impedance control signal based on the temperature and the supply voltage of the output buffer to substantially reduce a difference between an output impedance of the driver circuit and a characteristic impedance of the line; and
   a slew rate control signal generator to generate the slew rate control signal based on the temperature, the supply voltage, and the impedance control signal; and
wherein the compensation circuit is coupled to provide the slew rate control signal to the pre-driver circuit and is coupled to provide the impedance control signal to the driver circuit.

8. The output buffer of claim 7 wherein:
the impedance control signal comprises a plurality of impedance control signals; and
the slew rate control signal generator comprises:
   a control voltage generator comprising:
      a voltage divider coupled between a first reference voltage and a second reference voltage, a control voltage line being connected to an intermediate point between the first and second reference voltages;
      a logic circuit coupled to receive the impedance control signals;
      a plurality of pull-up transistors coupled between a first reference voltage and the control voltage line, each pull-up transistor being switched on or off by one of the impedance control signals;
      a plurality of pull-down transistors coupled between the control voltage line and a second reference voltage, each pull-down transistor being switched on or off by one of the impedance control signals; and
      wherein a control voltage is generated based on the impedance control signals; and
   a feedback circuit to convert the control voltage into the slew rate control signal comprising a plurality of slew rate control signals, the feedback circuit comprising:
      a reference circuit comprising a plurality of transistors coupled in parallel between a third reference voltage and a first end of a resistor, a second end of the resistor being coupled to a fourth reference voltage;
      a comparator coupled to receive the control voltage at a first input and having a second input connected to the first end of the resistor;
      an up/down counter coupled to an output of the comparator, the up/down counter having an output from which to generate the slew rate control signals based on a comparison of the control voltage with the voltage at the first end of the resistor, the output of the up/down counter being coupled to provide the slew rate control signals respectively to the transistors in the reference circuit and to the pre-driver circuit; and
wherein the slew rate control signals are generated based on the impedance control signals.

9. A system comprising:
a bus;
a driver circuit connected to a line in the bus and having a variable impedance controlled by an impedance control signal; and
a pre-driver circuit to control a slew rate of the driver circuit according to a slew rate control signal that is generated in response to the impedance control signal.

10. The system of claim 9, further comprising a compensation circuit to generate the impedance control signal to substantially reduce a difference between an output impedance of the driver circuit and a characteristic impedance of the line, the pre-driver circuit having elements to control the slew rate of the driver circuit to be approximately uniform during changes in the output impedance of the driver circuit.

11. The system of claim 9 wherein:
the driver circuit includes an input and an output terminal connected to the line to drive a data signal on to the line; and
the pre-driver circuit has an output coupled to the input of the driver circuit to provide the data signal to the driver circuit, the pre-driver circuit including elements to adjust a slew rate of the data signal at the input of the driver circuit to control a slew rate of the data signal at the output terminal.

12. The system of claim 11 wherein the driver circuit comprises:
a plurality of p-channel transistors connected in parallel between a first voltage reference and the output terminal, each p-channel transistor having a control terminal coupled to the output of the pre-driver circuit to receive a control signal based on the data signal and the impedance control signal;
a plurality of n-channel transistors connected in parallel between the output terminal and a second voltage reference, each n-channel transistor having a control terminal coupled to the output of the pre-driver circuit to receive a control signal based on the data signal and the impedance control signal; and
wherein the variable impedance of the driver circuit is determined by a number of the p-channel transistors or the n-channel transistors that are switched on.

13. The system of claim 11 wherein the pre-driver circuit comprises:
a plurality of inverters coupled in parallel between a first rail and a second rail, each inverter having an input coupled to receive the data signal and an output coupled to provide an inverted data signal to a control terminal of a transistor in the driver circuit;

a plurality of first transistors coupled in parallel between a first voltage reference and the first rail, each of the first transistors having a control terminal coupled to receive a first slew rate control signal to control a state of the first transistor; and a plurality of second transistors coupled in parallel between a second voltage reference and the second rail, each of the second transistors having a control terminal coupled to receive a second slew rate control signal to control a state of the second transistor.

14. The system of claim 11, further comprising:

a temperature detection circuit to detect a temperature of the system;

a voltage detection circuit to detect a supply voltage of the system;

a compensation circuit comprising:

an impedance control signal generator to generate the impedance control signal based on the temperature and the supply voltage of the system; and a slew rate control signal generator to generate the slew rate control signal based on the temperature, the supply voltage, and the impedance control signal; and wherein the compensation circuit is coupled to provide the slew rate control signal to the pre-driver circuit and is coupled to provide the impedance control signal to the driver circuit.

15. The system of claim 14 wherein:

the impedance control signal comprises a plurality of impedance control signals; and the slew rate control signal generator comprises:

a control voltage generator comprising:

a voltage divider coupled between a first reference voltage and a second reference voltage, a control voltage line being connected to an intermediate point between the first and second reference voltages;

a logic circuit coupled to receive the impedance control signals;

a plurality of pull-up transistors coupled between a first reference voltage and the control voltage line, each pull-up transistor being switched on or off by one of the impedance control signals;

a plurality of pull-down transistors coupled between the control voltage line and a second reference voltage, each pull-down transistor being switched on or off by one of the impedance control signals; and wherein a control voltage is generated based on the impedance control signals; and a feedback circuit to convert the control voltage into the slew rate control signal comprising a plurality of slew rate control signals, the feedback circuit comprising:

a reference circuit comprising a plurality of transistors coupled in parallel between a third reference voltage and a first end of a resistor, a second end of the resistor being coupled to a fourth reference voltage;

a comparator coupled to receive the control voltage at a first input and having a second input connected to the first end of the resistor;

an up/down counter coupled to an output of the comparator, the up/down counter having an output from which to generate the slew rate control signals based on a comparison of the control voltage with the voltage at the first end of the resistor, the output of the up/down counter being coupled to provide the slew rate control signals respectively to the transistors in the reference circuit and to the pre-driver circuit; and wherein the slew rate control signals are generated based on the impedance control signals.

16. The system of claim 9, further comprising:

a processor connected to the bus;

a memory device connected to the bus; and an input/output device connected to the bus.

17. A method comprising:

driving a data signal on to a line with a driver circuit;

controlling an impedance of the driver circuit according to an impedance control signal; and controlling a slew rate of the driver circuit according to a slew rate control signal that is generated in response to the impedance control signal.

18. The method of claim 17 wherein controlling a slew rate comprises controlling a slew rate of the driver circuit to be approximately uniform during changes in the impedance of the driver circuit.

19. The method of claim 17 wherein:

controlling an impedance comprises controlling an output impedance and an input capacitance of the driver circuit; and controlling a slew rate comprises controlling a slew rate of the driver circuit to be approximately uniform during changes in the input capacitance of the driver circuit.

20. The method of claim 17 wherein controlling an impedance comprises controlling an output impedance of the driver circuit to substantially reduce a difference between the output impedance and a characteristic impedance of the line.

21. The method of claim 20 wherein controlling an impedance further comprises controlling the output impedance of the driver circuit based on a temperature of the driver circuit and a supply voltage provided to the driver circuit.

22. The method of claim 17 wherein:

controlling an impedance further comprises:

generating the impedance control signal; and controlling a plurality of transistors coupled in parallel between a reference voltage and the line according to the impedance control signal to drive the data signal on to the line and to substantially reduce a difference between an impedance of the transistors and a characteristic impedance of the line; and controlling a slew rate further comprises:

generating the slew rate control signal based on the impedance control signal; and providing the data signal to control terminals of the transistors to control the transistors based on the slew rate control signal.

23. A method for operating a system comprising:

driving a data signal on to a line in the system with a driver circuit in a first device;

receiving the signal in a second device;

controlling an impedance of the driver circuit according to an impedance control signal; and controlling a slew rate of the driver circuit according to a slew rate control signal that is generated in response to the impedance control signal, the slew rate being controlled to be approximately uniform in response to changes in the impedance of the driver circuit.

24. The method of claim 23 wherein:
controlling an impedance comprises controlling an output impedance and an input capacitance of the driver circuit; and
controlling a slew rate comprises controlling a slew rate of the driver circuit to be approximately uniform during changes in the input capacitance of the driver circuit.

25. The method of claim 23 wherein controlling an impedance comprises controlling an output impedance of the driver circuit to substantially reduce a difference between the output impedance and a characteristic impedance of the line.

26. The method of claim 25 wherein controlling an impedance further comprises controlling the output impedance of the driver circuit based on a temperature of the driver circuit and a supply voltage provided to the driver circuit.

27. An output buffer comprising:
a driver circuit having an impedance, an input capacitance dependent on the impedance, an input, and an output terminal connected to a line to drive a data signal on to the line; and
a pre-driver circuit comprising:
a plurality of inverters coupled in parallel between a first rail and a second rail, each inverter having an input coupled to receive the data signal and an output coupled to provide an inverted data signal to a control terminal of a transistor in the driver circuit;
a plurality of first transistors coupled in parallel between a first voltage reference and the first rail, each of the first transistors having a control terminal coupled to receive a first pre-driver signal to control a state of the first transistor;
a plurality of second transistors coupled in parallel between a second voltage reference and the second rail, each of the second transistors having a control terminal coupled to receive a second pre-driver signal to control a state of the second transistor;
an output coupled to the input of the driver circuit to provide the data signal to the driver circuit; and
wherein the inverters, the first transistors, and the second transistors are coupled to adjust a slew rate of the data signal at the input of the driver circuit based on the input capacitance of the driver circuit to control a slew rate of the data signal at the output terminal.

28. An output buffer comprising:
a driver circuit having an impedance, an input capacitance dependent on the impedance, an input, and an output terminal connected to a line to drive a data signal on to the line;
a pre-driver circuit having an output coupled to the input of the driver circuit to provide the data signal to the driver circuit, the pre-driver circuit including elements to adjust a slew rate of the data signal at the input of the driver circuit based on the input capacitance of the driver circuit to control a slew rate of the data signal at the output terminal;
a temperature detection circuit to detect a temperature of the output buffer;
a voltage detection circuit to detect a supply voltage of the output buffer;
a compensation circuit comprising:
an impedance control signal generator to generate an impedance control signal based on the temperature and the supply voltage of the output buffer to substantially reduce a difference between an output impedance of the driver circuit and a characteristic impedance of the line; and
a slew rate control signal generator to generate a slew rate control signal based on the temperature, the supply voltage, and the impedance control signal; and
wherein the compensation circuit is coupled to provide the slew rate control signal to the pre-driver circuit and is coupled to provide the impedance control signal to the driver circuit.

29. The output buffer of claim 28 wherein:
the impedance control signal comprises a plurality of impedance control signals; and
the slew rate control signal generator comprises:
a control voltage generator comprising:
a voltage divider coupled between a first reference voltage and a second reference voltage, a control voltage line being connected to an intermediate point between the first and second reference voltages;
a logic circuit coupled to receive the impedance control signals;
a plurality of pull-up transistors coupled between a first reference voltage and the control voltage line, each pull-up transistor being switched on or off by one of the impedance control signals;
a plurality of pull-down transistors coupled between the control voltage line and a second reference voltage, each pull-down transistor being switched on or off by one of the impedance control signals; and
wherein a control voltage is generated based on the impedance control signals; and
a feedback circuit to convert the control voltage into the slew rate control signal comprising a plurality of slew rate control signals, the feedback circuit comprising:
a reference circuit comprising a plurality of transistors coupled in parallel between a third reference voltage and a first end of a resistor, a second end of the resistor being coupled to a fourth reference voltage;
a comparator coupled to receive the control voltage at a first input and having a second input connected to the first end of the resistor;
an up/down counter coupled to an output of the comparator, the up/down counter having an output from which to generate the slew rate control signals based on a comparison of the control voltage with the voltage at the first end of the resistor, the output of the up/down counter being coupled to provide the slew rate control signals respectively to the transistors in the reference circuit and to the pre-driver circuit; and
wherein the slew rate control signals are generated based on the impedance control signals.

30. A system comprising:
a bus;
a driver circuit including an input, an output terminal connected to a line in the bus to drive a data signal on to the line, and having a variable impedance controlled by an impedance control signal; and
a pre-driver circuit comprising:
a plurality of inverters coupled in parallel between a first rail and a second rail, each inverter having an input coupled to receive the data signal and an output coupled to provide an inverted data signal to a control terminal of a transistor in the driver circuit;

a plurality of first transistors coupled in parallel between a first voltage reference and the first rail, each of the first transistors having a control terminal coupled to receive a first slew rate control signal to control a state of the first transistor;

a plurality of second transistors coupled in parallel between a second voltage reference and the second rail, each of the second transistors having a control terminal coupled to receive a second slew rate control signal to control a state of the second transistor; and elements coupled to receive the impedance control signal and to adjust a slew rate of the data signal at the control terminal in the driver circuit to control a slew rate of the data signal at the output terminal based on the impedance control signal.

31. A system comprising:

a bus;

a driver circuit including an input, an output terminal connected to a line in the bus to drive a data signal on to the line, and having a variable impedance controlled by an impedance control signal; and a pre-driver circuit comprising:
  an output coupled to the input of the driver circuit to provide the data signal to the driver circuit; and
  elements to adjust a slew rate of the data signal at the input of the driver circuit according to a slew rate control signal that is based on the impedance control signal to control a slew rate of the data signal at the output terminal;

a temperature detection circuit to detect a temperature of the system;

a voltage detection circuit to detect a supply voltage of the system;

a compensation circuit comprising:
  an impedance control signal generator to generate the impedance control signal based on the temperature and the supply voltage of the system; and
  a slew rate control signal generator to generate the slew rate control signal based on the temperature, the supply voltage, and the impedance control signal; and wherein the compensation circuit is coupled to provide the slew rate control signal to the pre-driver circuit and is coupled to provide the impedance control signal to the driver circuit.

32. The system of claim 31 wherein:

the impedance control signal comprises a plurality of impedance control signals; and the slew rate control signal generator comprises:

a control voltage generator comprising:
  a voltage divider coupled between a first reference voltage and a second reference voltage, a control voltage line being connected to an intermediate point between the first and second reference voltages;
  a logic circuit coupled to receive the impedance control signals;
  a plurality of pull-up transistors coupled between a first reference voltage and the control voltage line, each pull-up transistor being switched on or off by one of the impedance control signals;
  a plurality of pull-down transistors coupled between the control voltage line and a second reference voltage, each pull-down transistor being switched on or off by one of the impedance control signals; and
  wherein a control voltage is generated based on the impedance control signals; and a feedback circuit to convert the control voltage into the slew rate control signal comprising a plurality of slew rate control signals, the feedback circuit comprising:
  a reference circuit comprising a plurality of transistors coupled in parallel between a third reference voltage and a first end of a resistor, a second end of the resistor being coupled to a fourth reference voltage;
  a comparator coupled to receive the control voltage at a first input and having a second input connected to the first end of the resistor;
  an up/down counter coupled to an output of the comparator, the up/down counter having an output from which to generate the slew rate control signals based on a comparison of the control voltage with the voltage at the first end of the resistor, the output of the up/down counter being coupled to provide the slew rate control signals respectively to the transistors in the reference circuit and to the pre-driver circuit; and wherein the slew rate control signals are generated based on the impedance control signals.

33. A method comprising:

driving a data signal on to a line with a driver circuit;

controlling an output impedance of the driver circuit based on a temperature of the driver circuit and a supply voltage provided to the driver circuit to substantially reduce a difference between the output impedance and a characteristic impedance of the line; and controlling a slew rate of the driver circuit based on the output impedance of the driver circuit.

34. A method for operating a system comprising:

driving a data signal on to a line in the system with a driver circuit in a first device;

receiving the data signal in a second device;

controlling an output impedance of the driver circuit based on a temperature of the driver circuit and a supply voltage provided to the driver circuit to substantially reduce a difference between the output impedance and a characteristic impedance of the line; and controlling a slew rate of the driver circuit to be approximately uniform in response to changes in the output impedance of the driver circuit.

* * * * *

UNITED STATES PATENT AND TRADEMARK OFFICE
CERTIFICATE OF CORRECTION

PATENT NO. : 6,288,563 B1
DATED : September 11, 2001
INVENTOR(S) : Muljono et al.

It is certified that error appears in the above-identified patent and that said Letters Patent is hereby corrected as shown below:

Column 4,
Line 1, delete "generate" and insert -- generated --, therefor.
Line 6, delete "rat control" and insert -- rate control --, therefor.
Line 15, delete "CLOAD" and insert -- $C_{LOAD}$ --, therefor.

Column 5,
Line 29, delete "CLOAD" and insert -- $C_{LOAD}$ --, therefor.
Line 30, delete "CLOAD" and insert -- $C_{LOAD}$ --, therefor.

Column 10,
Line 36, delete "1000 to 1" and insert -- 1000 to 1111 --, therefor.
Line 38, delete "CLOAD" and insert -- $C_{LOAD}$ --, therefor.

Column 12, claim 1,
Line 26, delete "bv" and insert -- by --, therefor.

Signed and Sealed this

Nineteenth Day of March, 2002

Attest:

*Attesting Officer*

JAMES E. ROGAN
*Director of the United States Patent and Trademark Office*